US011744037B1

(12) United States Patent
Cai et al.

(10) Patent No.: US 11,744,037 B1
(45) Date of Patent: Aug. 29, 2023

(54) DUCT ARRANGEMENT FOR COOLING SERVER DIMM OR OTHER HEAT-GENERATING COMPONENTS

(71) Applicant: Amazon Technologies, Inc., Seattle, WA (US)

(72) Inventors: Steve Qingjun Cai, Snoqualmie, WA (US); Ismael Medrano, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 2 days.

(21) Appl. No.: 17/361,005

(22) Filed: Jun. 28, 2021

(51) Int. Cl.
    H05K 7/20 (2006.01)

(52) U.S. Cl.
    CPC ..... *H05K 7/20145* (2013.01); *H05K 7/20727* (2013.01)

(58) Field of Classification Search
    CPC ........... H05K 7/20145; H05K 7/20172; H05K 1/0203; H05K 7/20618; H05K 7/20718; H05K 2201/10159; H05K 7/20272; G06F 1/20; G06F 1/3225; G06F 2200/201; G06F 1/181; H01L 23/467; F28F 13/12
    USPC .. 361/695, 694, 690, 679.49, 679.5, 679.46, 361/689, 720, 719; 165/104.33, 80.3; 257/E23.099
    See application file for complete search history.

(56) References Cited

U.S. PATENT DOCUMENTS

| | | | | |
|---|---|---|---|---|
| 4,851,965 A * | 7/1989 | Gabuzda | ............ | H05K 7/20154 361/822 |
| 5,361,188 A * | 11/1994 | Kondou | ................ | H01L 23/467 165/104.34 |
| 5,583,316 A * | 12/1996 | Kitahara | .................. | F28F 3/048 361/720 |
| 6,018,458 A * | 1/2000 | Delia | .................. | H05K 7/20154 361/720 |
| 6,113,485 A * | 9/2000 | Marquis | .................... | G06F 1/20 165/80.3 |
| 6,366,461 B1 * | 4/2002 | Pautsch | .................. | H01L 23/467 361/689 |
| 6,449,150 B1 * | 9/2002 | Boone | ................ | H05K 7/20563 361/720 |
| 6,462,948 B1 * | 10/2002 | Leija | .................. | H05K 7/20727 174/16.3 |
| 9,075,581 B2 * | 7/2015 | Stock | .................. | H05K 7/20727 |
| 9,915,985 B1 * | 3/2018 | Chen | .................. | H05K 7/20145 |
| 2002/0159232 A1 * | 8/2002 | Beitelmal | | |
| 2004/0042177 A1 * | 4/2004 | Geva | | |
| 2004/0218359 A1 * | 11/2004 | Malone | | |
| 2007/0064387 A1 * | 3/2007 | Matsumoto | | |
| 2013/0155606 A1 * | 6/2013 | Sasaki | .................. | H01L 23/467 361/679.47 |

(Continued)

Primary Examiner — Mandeep S Buttar
(74) Attorney, Agent, or Firm — Kilpatrick Townsend & Stockton LLP

(57) ABSTRACT

An airflow duct can be arranged at least in part in a zone alongside an electronics board mounted to a motherboard. The airflow duct can include an inlet end arranged to receive airflow into the airflow duct. A closed end wall can be arranged opposite the inlet end. A set of walls may extend from the inlet end to the closed end wall and include a top wall, a bottom wall, a first lateral side wall, and a second lateral side wall. Orifices can be included in the set of walls and can be arranged to direct airflow from within the airflow duct toward heat-producing components borne by the electronics board.

19 Claims, 5 Drawing Sheets

(56) References Cited

U.S. PATENT DOCUMENTS

2017/0099746 A1\* 4/2017 Rubenstein ............... G06F 1/20
2020/0084911 A1\* 3/2020 Mitsui
2022/0011836 A1\* 1/2022 Beyer ..................... G06F 1/182

\* cited by examiner

DUCT ARRANGEMENT FOR COOLING SERVER DIMM OR OTHER HEAT-GENERATING COMPONENTS

BACKGROUND

Datacenters house collections of servers and networking hardware, including switches and routers. As the demand for datacenters continues to increase, reliability and availability of computing resources becomes an important concern.

Service life of components can directly impact reliability and availability of computing resources. For example, longer or more reliable service life may allow components to be replaced and/or serviced less frequently and thus reduce overall down time for repair or replacement during routine maintenance and/or response to equipment failure. For many components, service life may be impacted by operating temperatures of environments in which the components are implemented. Thus, implementing suitable techniques for cooling and/or regulating operating temperatures may be an important consideration for improving service life and reducing impacts on reliability and availability of computing resources.

BRIEF DESCRIPTION OF THE DRAWINGS

Various embodiments in accordance with the present disclosure will be described with reference to the drawings, in which.

DETAILED DESCRIPTION

Techniques described herein can relate to assemblies that may be utilized to provide cooling, for example, within a computer server. An airflow duct may be provided and sized for fitting between components to be cooled. The components to be cooled may correspond to motherboard-mounted electronics boards, such as dual in-line memory modules (DIMM) or peripheral component interconnect express (PCIE) cards, for example. The airflow duct may be positioned in a gap between adjacent electronics boards in use. When the airflow duct is located in the gap, orifices through the sides of the airflow duct can be arranged opposite memory dies, processors, or other heat-producing elements borne by the electronics boards. Airflow may be introduced through an open front end of the airflow duct and forced through the orifices. As a result, air flowing into the duct may be re-directed to change direction by flowing through the orifices. For example, the air may change from flowing in a parallel manner between the electronics boards and into a flow that includes at least some portion directed at least partially toward the electronics boards.

Air flowing through the orifices may form air jets aimed at the heat-producing elements. The airflow from the jets may carry heat away from the heat-producing elements and along the airflow duct to exhaust heat out a rear of the gap. Overall, the airflow duct and orifices may provide targeted cooling with air re-directed toward the heat-producing elements, which may increase cooling in comparison to airflow that is instead merely permitted to pass in a parallel direction between the electronics boards. The enhanced cooling may reduce operating temperatures and extend service life of the electronics boards compared to arrangements that lack the airflow duct.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Figure 1:
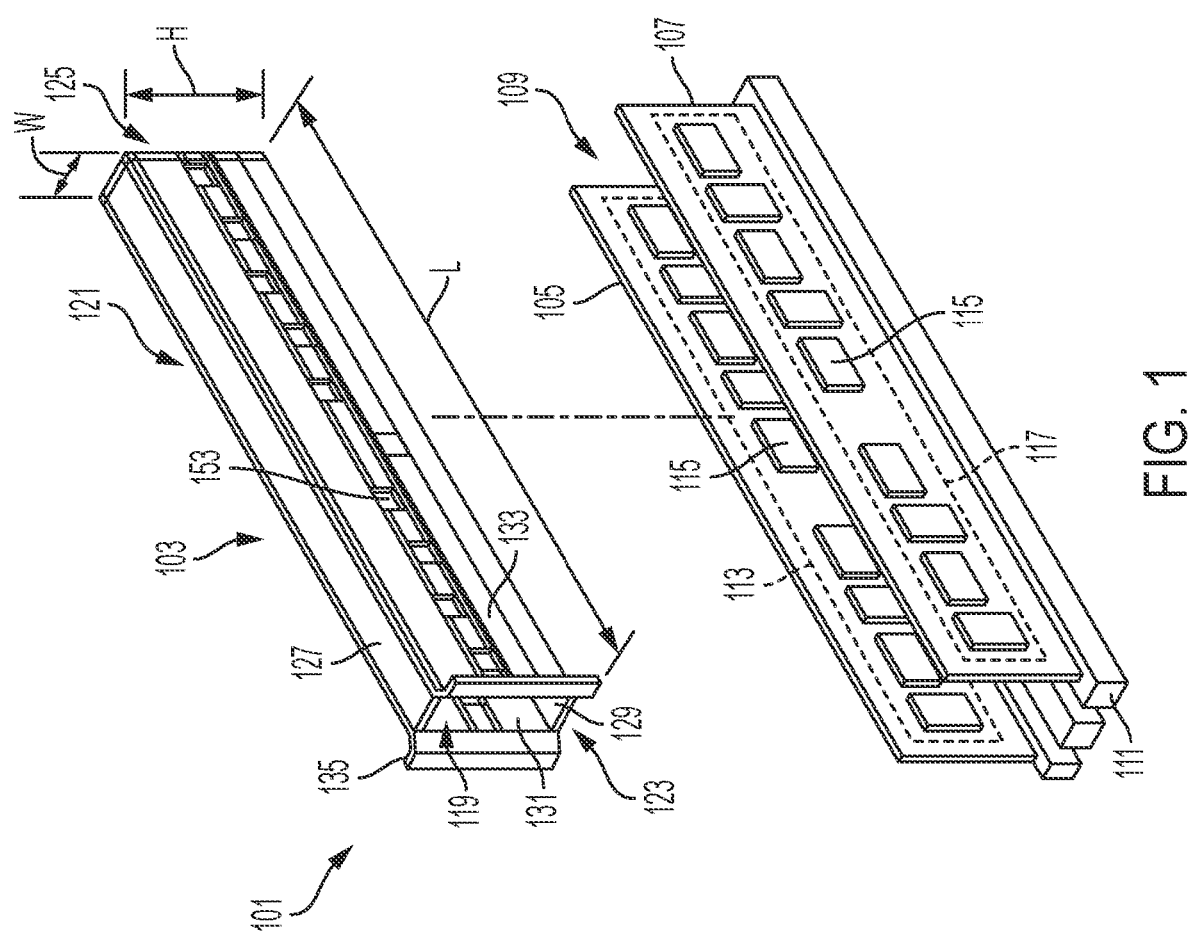
FIG. 1 shows a system having an airflow duct in accordance with various embodiments.

FIG. 1 illustrates a system 101 having an airflow duct 103 according to various embodiments. The system 101 can include at least a first electronics board 105 and may further include a second electronics board 107. A zone 109 may be defined adjacent and/or alongside the first electronics board 105, e.g., alongside a length of the first electronics board 105. The zone 109 may correspond to a gap in between the first electronics board 105 and the second electronics board 107 and as such will be alternatively referred to herein as gap 109. For example, the first electronics board 105 and the second electronics board 107 can be positioned adjacent one another, e.g., so as to define the gap 109 in between the first electronics board 105 and the second electronics board 107. For example, the first electronics board 105 and the second electronics board 107 may each be coupled with structure that may be connected with, or part of, a motherboard 111. Generally, the airflow duct 103 may be installed at least in part in the gap 109. The airflow duct 103 may direct air flow relative to the first electronics board 105 and/or the second electronics board 107, such as to enhance or facilitate airflow or cooling relative to the first electronics board 105 and/or the second electronics board 107. For example, although discussion herein will primarily reference airflow toward both the first electronics board 105 and the second electronics board 107, in some embodiments, airflow may be direct toward a single option instead (e.g., in situations in which the other is not present or is not subject to similar airflow benefits).

The system 101 may include or correspond to components of a server, network switch, or other appliance that may be implemented in a datacenter or other context. The first electronics board 105 and the second electronics board 107 may correspond to any suitable type. In various embodiments, the first electronics board 105 and/or the second electronics board 107 may each correspond to a card mountable to the motherboard 111. One non-limiting example includes a dual integrated memory module (DIMM). Another example includes a peripheral component interconnect express (PCIE) card.

The first electronics board 105 can bear a first set 113 of heat-producing components 115, and the second electronics board 107 can bear a second set 117 of heat-producing components 115. The first set 113 of the heat-producing components 115 may be arranged on one or both sides along a length of the first electronics board 105. The second set 117 of the heat-producing components 115 may be arranged on one or both sides along a length of the second electronics board 107. The heat-producing components 115 of the first set 113 and the second set 117 are depicted as replicas of each other in FIG. 1, although different types, arrangements, and/or combinations may be utilized in the first set 113 relative to the second set 117.

The heat-producing components 115 may correspond to components on different types of electronics boards or elements within a server or datacenter appliance. As one non-limiting example, at least one of the heat-producing components 115 may correspond to a memory die (e.g., as in the case of a DIMM for the first electronics board 105 and/or the second electronics board 107). As another non-limiting example, at least one of the heat-producing components 115 may correspond to a processor (e.g., such as in the case of a PCIE card for the first electronics board 105 and/or the second electronics board 107).

In use, the airflow duct 103 may be positioned to provide and/or facilitate cooling relative to the first electronics board 105 and/or the second electronics board 107. For example, the airflow duct 103 may include suitable structure for facilitating cooling relative to the first set 113 of heat-producing components 115 and/or relative to the second set 117 of heat-producing components 115.

The airflow duct 103 can include an internal volume 119 and a body 121. The body 121 may at least partly define and/or bound the internal volume 119. The body 121 can be formed of plastic, polycarbonate, silicon, or any other suitable material or combinations of materials. In some embodiments, forming the body 121 of a non-conductive material can mitigate against a possibility of electrical shorting or other damage in case of contact with the motherboard 111, the first electronics board 105, and/or the second electronics board 107 during installation.

The body 121 can define an inlet end 123. For example, the inlet end 123 may be arranged at a front end of the internal volume 119. The inlet end 123 may be arranged to receive airflow into the airflow duct 103. At an opposite side of the body 121 (e.g., at a rear of the internal volume 119), the body 121 can include a closed end wall 125.

The body 121 of the airflow duct 103 can include a set of walls that extend from the inlet end 123 to the closed-end wall 125. The extending walls may include a top wall 127, a bottom wall 129, a first lateral side wall 131 (e.g., positioned toward a left side of FIG. 1), and a second lateral side wall 133 (e.g., positioned toward a right side of FIG. 1).

The top wall 127 and the bottom wall 129 may join the first lateral side wall 131 and the second lateral side wall 133 together. For example, these parts may be arranged so that inner surfaces of the top wall 127, the first lateral side wall 131, the bottom wall 129, and the second lateral side wall 133 define a perimeter of the internal volume 119 of the airflow duct 103.

The body 121 of the airflow duct 103 may define respective dimensions and/or directions such as a length L, a width W, and a height H. The length L may be defined extending toward and/or including the front and/or the rear of the internal volume 119, and/or may be defined extending toward and/or including the inlet end 123 and/or the closed end wall 125, for example. The width W may be defined extending toward and/or including the first lateral side wall 131 and/or the second lateral side wall 133. The height H may be defined extending toward and/or including the top wall 127 and/or the bottom wall 129.

The first lateral side wall 131 can be spaced apart from the second lateral side wall 133 to permit outer surfaces of the first lateral side wall 131 and the second lateral side wall 133 to fit within the gap 109. For example, the airflow duct 103 may have a width W that is sufficiently narrow to fit within the gap 109.

The top wall 127 and the bottom wall 129 can be spaced apart by distance that may allow outer surfaces of the top wall 127 and the bottom wall 129 to fit within a predetermined space. For example, the airflow duct 103 may be sized so that at least a portion of the height H fits within a maximum height of the first electronics board 105 and/or of the second electronics board 107.

The inlet end 123 and the closed end wall 125 can be spaced apart by distance that may allow the length L to fit a predetermined space. For example, the airflow duct 103 may be sized so that at least a portion of the length L fits within the gap 109.

The airflow duct 103 can further include a baffle 135. The baffle 135 may be arranged to direct airflow into the internal volume 119 of the airflow duct 103. The baffle 135 can include structure that can extend outwardly from the first lateral side wall 131, the second lateral side wall 133, the top wall 127, and/or the bottom wall 129. Some examples of relative placement of the baffle 135 are discussed further with respect to FIG. 2.

Figure 2:
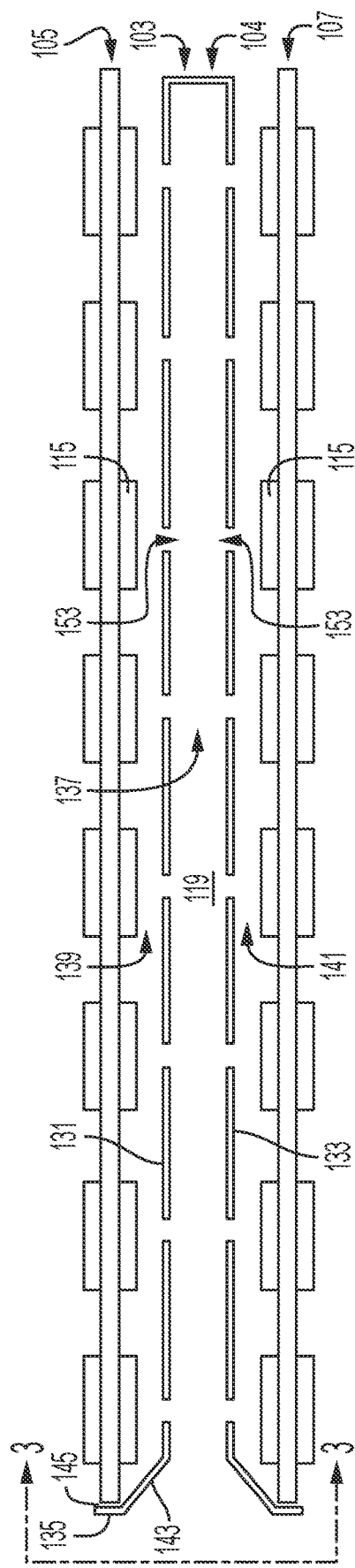
FIG. 2 shows a top sectional view of the airflow duct of FIG. 1 in an installed position in accordance with various embodiments.

FIG. 2 depicts a top sectional view of the airflow duct 103 installed between the first electronics board 105 and the second electronics board 107. When the airflow duct 103 is installed within the gap 109, the airflow duct 103 may define lanes, such as a central lane 137, a first lateral lane 139, and a second lateral lane 141. For example, the central lane 137 may correspond to space within the internal volume 119 or other space of the airflow duct 103. The first lateral lane 139 may correspond to a space in between the first lateral side wall 131 and the first electronics board 105. The second lateral lane 141 may correspond to a space between the second lateral side wall 133 of the airflow duct 103 and the second electronics board 107.

The baffle 135 can include suitable surfaces for directing airflow into the internal volume 119 and/or the central lane 137. For example, the baffle 135 in FIG. 2 includes sloped surfaces 143, e.g., which may slope toward the internal volume 119 for directing airflow into the internal volume 119. Although the baffle 135 in FIG. 2 is depicted with a small space 145 between the baffle 135 and the front edge of the first electronics board 105 and/or second electronics board 107, relatively larger, and/or smaller spaces 145 can be utilized to accommodate functions of respective elements. For example, the baffle 135 may be spaced apart from a front edge of the first electronics board 105 or the second electronics board 107 by a suitable size of space 145 to accommodate clearance for engagement structures (e.g., for engaging the first electronics board 105 and/or the second electronics board 107 to the motherboard 111) and/or for other suitable service structures and/or areas.

The baffle 135 may be positioned at a suitable location to block airflow from the front end of the gap 109 from entering into the first lateral lane 139 or the second lateral lane 141. Further examples are described with respect to FIG. 3.

Figure 3:
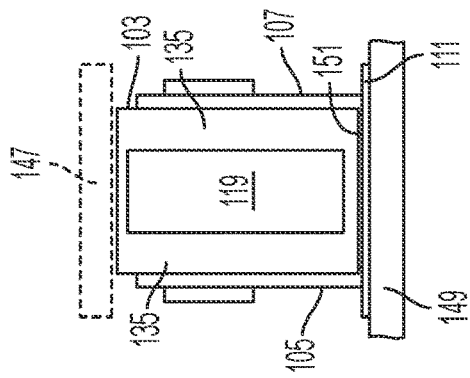
FIG. 3 shows a front view of the airflow duct of FIG. 2 in accordance with various embodiments.

FIG. 3 shows a front view of the airflow duct 103 positioned between the first electronics board 105 and the second electronics board 107. The baffle 135 can extend outwardly laterally (e.g., left and right) to block airflow arriving toward the front of the gap from flowing alongside the airflow duct 103. For example, in FIG. 3, the baffle 135 is positioned to obstruct the view of the first lateral lane 139 and the second lateral lane 141 shown in FIG. 2. Additionally or alternatively, the baffle 135 may extend vertically (e.g., up and/or down) to block airflow arriving toward the front of the 109 from flowing underneath the airflow duct 103 and/or over the airflow duct 103.

The airflow duct 103 can be supported vertically by any suitable structure. In some embodiments, the airflow duct 103 may be suspended from above. For example, the airflow duct may be coupled with a super-structure 147. The super-structure 147 may correspond to a lid that can be coupled with a base 149 in which the motherboard 111 is received. For example, in use, the base 149 and the lid may be coupled so as to enclose components of the system 101 within a volume defined by the base 149 and the lid. In some embodiments, the super-structure 147 may correspond to a cover over the first electronics board 105 and/or the second electronics board 107. For example, the cover may be arranged between the lid and the first electronics board 105 and/or the second electronics board 107. In some embodiments, the super-structure 147 may correspond to an airflow guide that may be present, such as over the first electronics board 105 and/or the second electronics board 107, under or over the cover, and/or under the lid. Although the super-structure 147 in FIG. 3 is shown as a distinct component that may be coupled with the airflow duct 103, in some embodiments, the airflow duct 103 may be coupled by being integrally formed with the super-structure 147 or other suitable structure for vertically arranging the airflow duct 103.

The airflow duct 103 may be spaced apart out of contact from the motherboard 111. For example, a slit 151 is shown in FIG. 3. The slit 151 may correspond to an opening, space, or area that is not airtight along the bottom of the airflow duct 103. The slit 151 may be sized such that any airflow passed along the underside or other edge of the baffle 135 and/or the airflow duct 103 is negligible, which may facilitate or allow the baffle 135 to not extend completely into contact with the motherboard 111. Contact with the motherboard 111 may be desirable to avoid, for example, to protect components and/or avoid incidental contact that may damage the motherboard 111 and/or other components.

Referring again to FIG. 2, the first lateral side wall 131 and the second lateral side wall 133 can include orifices 153. The orifices 153 can be arranged in alignment with the heat-producing components 115, for example. Examples of effects of the orifices 153 are discussed, for example, with respect to FIG. 4.

Figure 4:
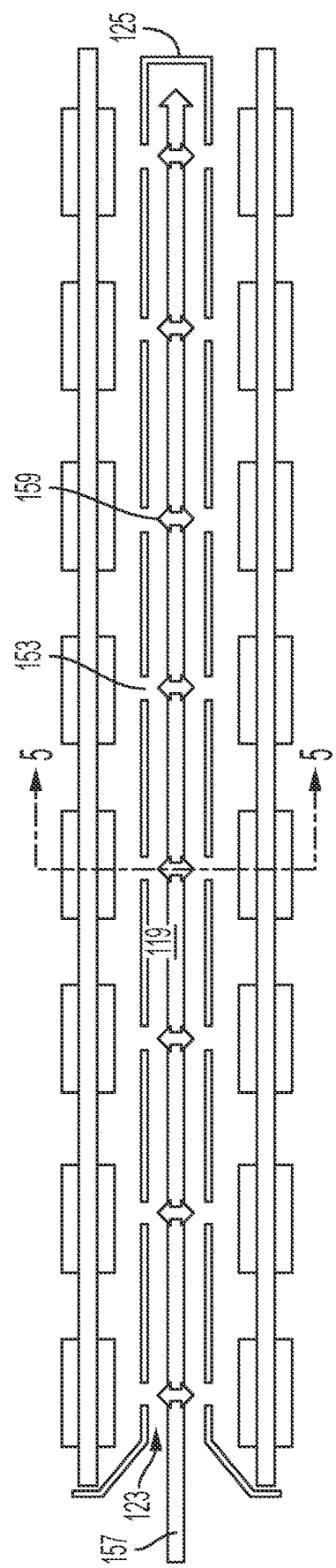
FIG. 4 shows the airflow duct of FIG. 2 in a state of receiving airflow in accordance with various embodiments.

FIG. 4 illustrates the airflow duct 103 in a state of receiving airflow in accordance with various embodiments. In use, airflow (e.g., as depicted by arrow 157) may be introduced through the inlet end 123 at the front of the internal volume 119. The airflow may be prevented from exiting through the closed end wall 125 at the rear of the internal volume 119. Blocking the airflow from exiting through the closed end wall 125 may force the airflow through the orifices 153, such as depicted by double-headed arrows 159.

Figure 5:
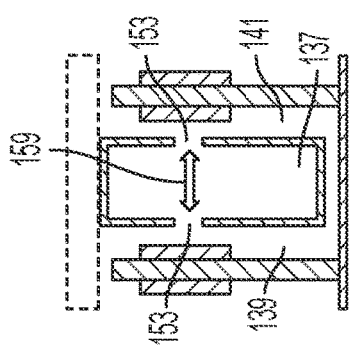
FIG. 5 shows a section view taken along the line 5 in FIG. 4.

FIG. 5 illustrates a section view taken along the line 5 in FIG. 4. The airflow being directed out of the central lane 137 (e.g., as depicted by arrow 159) may push airflow into space corresponding to the first lateral lane 139 and/or the second lateral lane 141.

Figure 6:
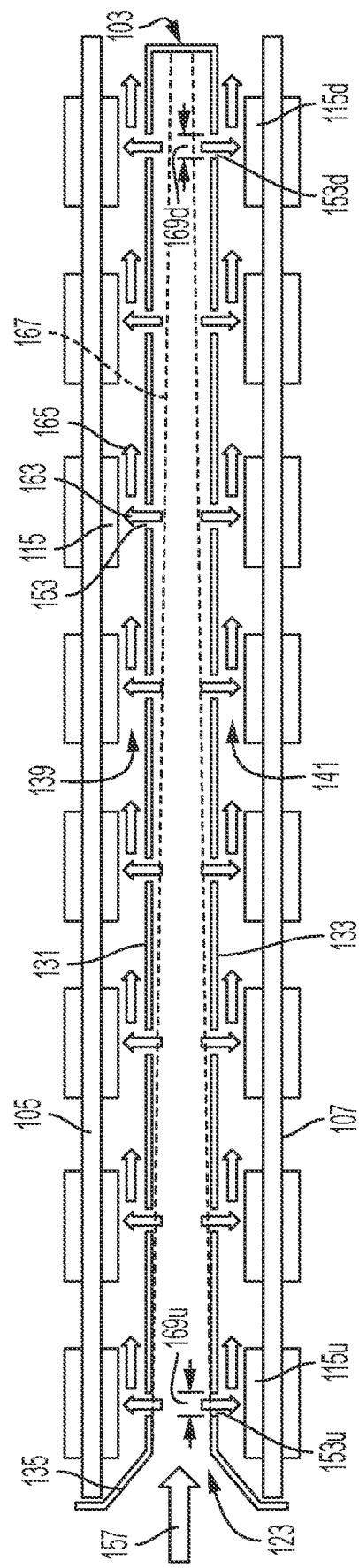
FIG. 6 shows the airflow duct of FIG. 2 in a state of outputting airflow in accordance with various embodiments.

FIG. 6 shows a top view with additional airflow characteristics in use in accordance with various embodiments. Airflow introduced (as at arrow 157 in FIG. 6) in the inlet end 123 may continue to cause air to flow out through the orifices 153 and produce cooling jets (depicted as arrows 163). As used herein, a jet may correspond to a rapid stream of fluid forced out of a small opening. The jets 163 may be aligned with the heat-producing components 115 and provide cooling to the heat-producing components 115. For example, the jets 163 may provide airflow capable of carrying away heat produced by the heat-producing components 115.

In operation, the jets 163 may avoid a mere parallel flow and instead provide an impingement flow that may provide improved heat transfer in comparison. For example, if the airflow duct 103 were absent, airflow introduced would continue along the direction illustrated by arrow 157 and generate a parallel flow over the heat-producing components 115. Such a parallel flow would be expected to form a boundary layer that increases in thickness (and thus drops in heat exchanging efficacy) while moving between entry and exit. In contrast, the jets 163 toward the heat-producing elements 115 may generate an impinging flow in which the boundary layer is not present to the same degree as in mere parallel flow and in which heat exchange is consequently increased in comparison with mere parallel flow.

Preliminary design simulation that has been performed with computerized heat-transfer simulation software validates performance of the airflow duct 103. For example, in one example of such preliminary design simulation, the first electronics board 105 was modeled with nine memory dies as heat-generating elements 115. The model included a single sensor located in the middle at a halfway point in accordance with a hypothetical arrangement in which a DIMM can include a sensor to register an operating temperature for diagnostics. Simulation was performed with two scenarios, first without any airflow duct 103, and second with an airflow duct 103 having orifices sized 5 mm by 5 mm. Inlet air characteristics were held constant in both scenarios. Results from the simulation are represented in the following table.

|  | Input air | Die 1 | Die 2 | Die 3 | Die 4 | Sensor | Die 5 | Die 6 | Die 7 | Die 8 | Die 9 |
| --- | --- | --- | --- | --- | --- | --- | --- | --- | --- | --- | --- |
| Scenario 1 (no airflow duct) | 44.1° C. | 63.5° C. | 73.7° C. | 75.4° C. | 79.9° C. | 79.1° C. | 80.1° C. | 81.1° C. | 84.9° C. | 83° C. | 83.5° C. |
| Scenario 2 (with airflow duct) | 44.1° C. | 71.9° C. | 68.3° C. | 69.1° C. | 66.7° C. | 70° C. | 65.7° C. | 64° C. | 60.5° C. | 59.7° C. | 56.9° C. |
| Difference | 0° C. | −8.4° C. | 5.4° C. | 6.3° C. | 13.2° C. | 9° C. | 14.4° C. | 17.1° C. | 24.4° C. | 23.3° C. | 26.6° C. |

Of note, the simulation indicated that a diagnostic based on the central sensor would show the airflow duct 103 causing a 9° C. drop in operating temperature. However, the simulation also showed other larger significant temperature differences as well. For example, as indicated in bold face font in the table above, although the simulation indicated that the location of the hottest die changed (e.g., Die 7 was the hottest in scenario 1 without the airflow duct 103 while Die 1 was the hottest in scenario 2 with the airflow duct), the simulation also indicated a significant difference (13° C.) between the maximum temperatures registered in each scenario (e.g., Die 7 at 84.9° C. in scenario 1 without the airflow duct 103 vs Die 1 at 71.9° C. in scenario 2 with the airflow duct). In addition, Die 9 registered the largest overall temperature difference (26.6° C.) between the scenarios (e.g., based on registering at 83.5° C. in scenario 1 without the airflow duct 103 and at 56.9° C. in scenario 2 with the airflow duct).

Referring further to FIG. 6, air may continue to flow after exiting as jets 163. For example, arrows 165 show air flowing through the first lateral lane 139 and/or the second lateral lane 141. Such flow outside and along the length of the airflow duct 103 may be at least partially in response to the direction of the airflow provided by the incoming air at 157 at the inlet end 123. For example, the flow of the incoming air 157 in one direction (e.g., from left to right in FIG. 6) may urge air that has exited as jets 163 to continue flowing in a similar direction (e.g., from left to right in FIG. 6). In some embodiments, the presence of the baffle 135 may block air from flowing through a front end of the first lateral lane 139 and/or the second lateral lane 141 and thus additionally or alternatively may contribute to directing of the air flow alongside the airflow duct 103 (e.g., away from the baffle 135).

In use, the jets 163 may be provided out multiple sides of the airflow duct 103. For example, orifices 153 in the first lateral side wall 131 may face (and/or provide cooling to) heat-producing components 115 of the first electronics board 105. Similarly, orifices 153 in the second lateral side wall 133 may face (and/or provide cooling to) heat-producing components 115 of the second electronics board 107.

The orifices 153 can be positioned in any suitable position for directing individual jets 163 toward individual heat-producing components 115. For example, as may be most readily appreciated with respect to FIG. 1, the orifices 153 can be pre-arranged at different heights along the airflow duct 103 to match a predetermined arrangement pattern of heat-producing components 115 from the first electronics board 105 and/or the second electronics board 107.

The airflow duct 103 may be subject to different pressure conditions at different internal locations. The airflow duct 103 may include features to account for such differences. For example, the airflow duct 103 may include features to normalize magnitudes of jets 163 in view of such possible pressure condition differences. By way of illustration, the heat-producing components 115 may include an upstream heat-producing component 115$u$ that within its respective set is arranged closest to the inlet end 123. In contrast, a downstream heat-producing component 115$d$ may correspond to a heat-producing components that among its set is arranged furthest from the inlet end 123. The orifices 153 can similarly include an upstream orifice 153$u$ (e.g., adjacent and/or aimed at the upstream heat-producing component 115$u$) and a downstream orifice 153$d$ (e.g., adjacent and/or aimed at the downstream heat-producing component 115$d$).

In operation, pressure provided by airflow entering the inlet end 123 may drop or be consumed at least in part by airflow directed out through the upstream orifice 153$u$. This may reduce an amount of airflow or mass flow rate available for producing a jet 163 through the downstream orifice 153$d$ if not accounted for. Various techniques or features can be implemented to normalize or cause magnitudes of jets to be similar to one another or closer to one another than if the feature were absent. For example, a taper (depicted by the inward dotted lines 167) can be introduced or present along at least some portion of the length L of the airflow duct 103, such as in any of the top wall 127, the bottom wall 129, the first lateral side wall 131, and/or the second lateral side wall 133. Such a taper 167 may produce a restriction and/or otherwise direct airflow in a manner that can modify pressure and/or mass flow rate available at respective locations. Accordingly, the taper 167 may be tuned or implemented to cause similar levels of air pressure to be available at entry of different orifices 153, e.g., to allow resulting jets 163 from the upstream orifice 153$u$ and the downstream orifice 153$d$ to be normalized or otherwise brought toward alignment in terms of magnitude with one another. As another option additionally or alternatively, the upstream orifice 153$u$ can include a dimension 169$u$ (such as a diameter or other relevant size) that may differ from a dimension 169$d$ of the downstream orifice 153$d$. The difference in sizes can cause cooling jets 163 provided by the respective upstream orifice 153$u$ and the downstream orifice 153$d$ to be similar magnitudes in response to different pressure levels available at the entry of the upstream orifice 153$u$ and the downstream orifice 153$d$, for example.

The orifices 153 may be any suitable size, shape, and/or arrangement. As one example, an orifice 153 may be a 5 mm×5 mm square hole. Other sizes and shapes may be suitable, including round, elliptical, star, or other polygonal or other types of shapes. Furthermore, although all of the orifices 153 are shown as being the same shape as one another in FIG. 1, orifices 153 may differ in size and/or shape from one another. In addition, although orifices 153 are shown arranged in a one-to-one arrangement with each orifice 153 arranged in alignment with a single corresponding heat-producing component 115, other arrangements are also possible, such as many-to-one arrangements in which multiple orifices 153 are directed toward or aligned with a single heat-producing component 115, or one-to-many arrangements in which a single orifice 153 is arranged to cool multiple heat-producing components 115. Further, although both sides of the airflow duct 103 are depicted having equal number of orifices 153, differing or equal numbers may be utilized on different sides (e.g., such that a first set of orifices through the first lateral side wall 131 may be alike or different in number, shape, arrangement etc. from a second set of orifices through the second lateral side wall 133).

Additionally, although the orifices 153 are depicted in FIG. 6 as positioned in line with or adjacent to the heat-producing components 115, some or all of the orifices 153 additionally or alternatively may be arranged upstream or downstream of corresponding heat-producing components 115 to be cooled. Some examples of placement of orifices 153 relative to target heat-producing components 115 are described below with respect to FIGS. 7 and 8.

Figure 8:
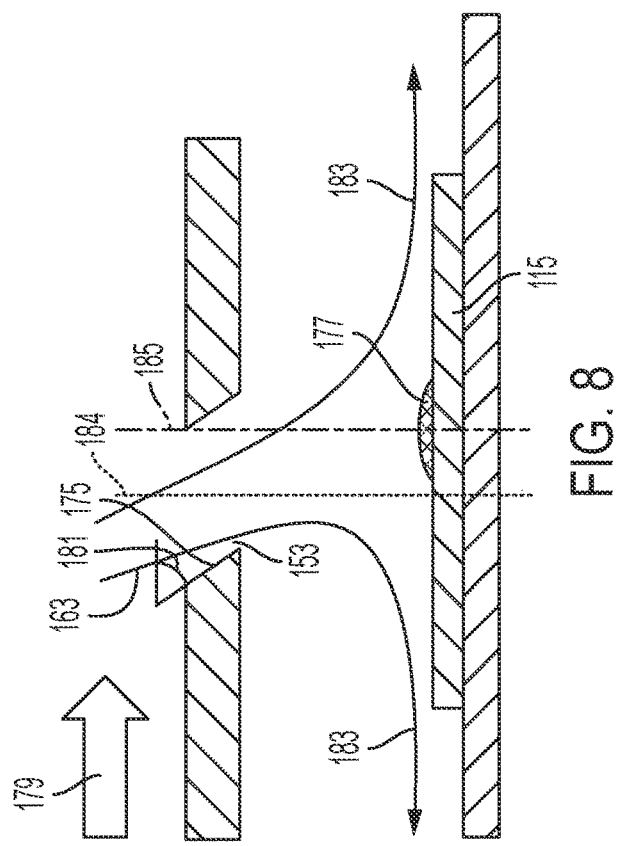
FIGS. 7 and 8 show examples of arrangements of orifices of the airflow duct of FIG. 2 in accordance with various embodiments.
Figure 7:
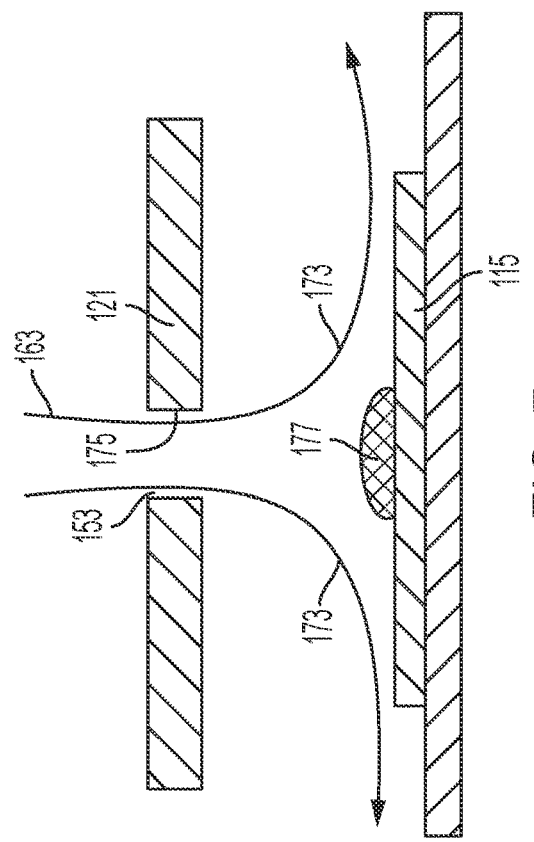

FIGS. 7 and 8 show various arrangements of orifices 153 according to some embodiments. Different airflow characteristics may be obtained by features of different orifices 153.

FIG. 7 illustrates an example in which airflow may be allowed to flow perpendicular through a wall of the body 121, such as depicted by arrows 173 in FIG. 7. Directionality of the airflow may be impacted by the shape and/or size of bore surfaces 175 of the orifice 153.

In some embodiments, the heat-producing components 115 may experience a stagnation zone 177 as airflow splits (as illustrated by arrows 173) to flow opposite directions against the heat-producing component 115. In various embodiments, the stagnation zone 177 is a suitably small magnitude to permit adequate heat transfer within the overall heat-producing element 115.

FIG. 8 in contrast illustrates an example in which airflow is directed in a jet 163 oriented in a non-perpendicular flow direction relative to the heat-producing component 115. The directionality of the jet 163 may be impacted by the airflow direction (e.g., depicted by arrow 179) at which air is provided relative to the orifice 153. The directionality of the jet 163 may further be impacted by an angle 181 of the bore surface 175 of the orifice 153. For example, the bore surface 175 may be angled relative to a length of the airflow duct 103 and cause the cooling jet 163 to be oriented at a non-perpendicular angle relative to the length direction L of the airflow duct 103. The provision of a non-perpendicular orientation of the jet 163 can permit the airflow to reach the heat-producing component 115 at a non-perpendicular orientation (e.g., as depicted by arrows 183). Overall, a non-perpendicular orientation of the jet 163 (e.g., in FIG. 8) may allow the stagnation zone 177 to be smaller than in arrangements with perpendicular flow (e.g., as in FIG. 7).

Referring again to FIG. 8, in some embodiments, the orifice 153 may be at least partially upstream of the heat-producing component 115. For example, a centerline 184 of the orifice 153 may be offset from a centerline 185 of the heat-producing component 115.

Based on the disclosure and teachings provided herein, a person of ordinary skill in the art will appreciate other ways and/or methods to implement the various embodiments. The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

The invention claimed is:

1. A server, comprising:
   a motherboard;
   a first DIMM bearing a first set of memory dies and mounted on the motherboard;
   a second DIMM bearing a second set of memory dies and mounted on the motherboard so as to be adjacent to the first DIMM and defining a gap between the first DIMM and the second DIMM;
   an airflow duct including a body bounding an internal volume and arranged at least in part in the gap between the first DIMM and the second DIMM, the airflow duct comprising:
      an inlet end comprising a baffle arranged to direct airflow into the internal volume of the airflow duct;
      a closed end wall arranged opposite the inlet end; and
      a set of walls extending from the inlet end to the closed end wall and including a top wall, a bottom wall, a first lateral side wall, and a second lateral side wall, the first lateral side wall facing the first DIMM and comprising a first set of orifices arranged to direct airflow from within the airflow duct as cooling jets toward the first set of memory dies of the first DIMM, and the second lateral side wall facing the second DIMM and comprising a second set of orifices arranged to direct airflow from within the airflow duct as cooling jets toward the second set of memory dies of the second DIMM, wherein the top wall and the bottom wall are spaced apart by a distance configured to permit outer surfaces of the top wall and the bottom wall to fit within a maximum height of at least one of the first DIMM or the second DIMM.

2. The server of claim 1, further comprising a superstructure arranged above the first DIMM and the second DIMM, wherein the airflow duct is coupled with the superstructure so as to be suspended from above for positioning within the gap between the first DIMM and the second DIMM.

3. The server of claim 1, wherein the first set of memory dies is arranged along a length of the first DIMM and comprises:

an upstream-most memory die that among the first set of memory dies is arranged closest to the inlet end; and a downstream-most memory die that among the first set of memory is arranged farthest from the inlet end.

4. The server of claim 3, wherein the first set of orifices comprises:
a first orifice arranged to direct airflow toward the upstream-most memory die; and
a second orifice arranged to direct airflow toward the downstream-most memory die.

5. The server of claim 4, wherein the second orifice and the first orifice are of different sizes to cause cooling jets provided by the second orifice and the first orifice to be similar magnitudes in response to different air pressure levels available at entry of the first orifice and the second orifice.

6. The server of claim 4, wherein the airflow duct has a length defined in a direction extending between the inlet end and the closed end wall, wherein at least some part of the set of walls of the airflow duct tapers inward along the length to cause similar levels of air pressure to be available at entry of the first orifice and the second orifice.

7. An electronic system, comprising:
a motherboard;
an electronics board mounted on the motherboard and defining a zone alongside a length of the electronics board;
an airflow duct arranged at least in part in the zone alongside the length of the electronics board, the airflow duct comprising:
an inlet end arranged to receive airflow into the airflow duct;
a closed end wall arranged opposite the inlet end; and
a set of walls extending from the inlet end to the closed end wall and including a top wall, a bottom wall, a first lateral side wall, and a second lateral side wall, the first lateral side wall comprising a set of orifices arranged to direct airflow from within the airflow duct toward the electronics board, wherein the top wall and the bottom wall are spaced apart by a distance configured to permit outer surfaces of the top wall and the bottom wall to fit within a maximum height of the electronics board.

8. The electronic system of claim 7, wherein:
the electronics board bears a set of heat-producing components; and
the set of orifices is arranged to direct airflow from within the airflow duct toward the set of heat-producing components of the electronics board.

9. The electronic system of claim 8, wherein the electronics board is a first electronics board and the electronic system further comprises a second electronics board mounted on the motherboard so as to be adjacent to the first electronics board and defining a gap between the first electronics board and the second electronics board, wherein the gap comprises the zone alongside the length of the first electronics board.

10. The electronic system of claim 9, wherein at least one of:
at least one of the first electronics board or the second electronics board comprises at least one of a PCIE card or a DIMM; or
at least one of the set of heat-producing components comprises at least one of a memory die or a processor.

11. The electronic system of claim 7, wherein the bottom wall is spaced apart out of contact from the motherboard.

12. The electronic system of claim 11, further comprising a baffle coupled with the inlet end and extending outwardly from set of walls so as to direct airflow arriving toward a front of the zone into an internal volume of the airflow duct and to block airflow arriving toward the front of the zone from flowing at least one of underneath or alongside the airflow duct.

13. An airflow duct for utilization in a zone defined alongside at least one electronics board bearing heat-producing elements within an electronic system, the airflow duct comprising:
a first lateral side wall;
a second lateral side wall spaced apart from the first lateral side wall by a distance configured to permit outer surfaces of the first lateral side wall and the second lateral side wall to fit within the zone;
a top wall;
a bottom wall, wherein the top wall and the bottom wall join the first lateral side wall and the second lateral side wall together so that inner surfaces of the top wall, the first lateral side wall, the bottom wall, and the second lateral side wall define a perimeter of an internal volume of the airflow duct, wherein the top wall and the bottom wall are spaced apart by a distance configured to permit outer surfaces of the top wall and the bottom wall to fit within a maximum height of the at least one electronics board;
an inlet end at a front of the internal volume and arranged to receive airflow into the airflow duct; and
a closed end wall at a rear of the internal volume, wherein at least one of the first lateral side wall or the second lateral side wall include orifices such that airflow through the inlet end at the front of the internal volume is prevented from exiting through the closed end wall at the rear of the internal volume and is forced through the orifices to produce cooling jets for cooling at least some of the heat-producing elements.

14. The airflow duct of claim 13, wherein a length direction is defined extending from the front to the rear of the internal volume, and wherein at least some of the orifices include bore surfaces that are angled relative to the length direction to cause the cooling jets to be oriented at a non-perpendicular angle relative to the length direction.

15. The airflow duct of claim 13, further comprising a baffle arranged to direct airflow into the internal volume of the airflow duct.

16. The airflow duct of claim 15, wherein the baffle extends outwardly from the bottom wall to block airflow arriving toward the front of the zone from flowing underneath the airflow duct.

17. The airflow duct of claim 15, wherein the baffle extends outwardly from at least one of the first lateral side wall or the second lateral side wall to block airflow arriving toward the front of the zone from flowing alongside the airflow duct.

18. The airflow duct of claim 15, wherein the baffle comprises sloped surfaces that slope toward the internal volume.

19. The airflow duct of claim 13, wherein the orifices are arranged at different heights along the airflow duct to match a predetermined arrangement pattern of heat-producing elements from the at least one electronics board.

* * * * *